United States Patent

Tomiyama

[11] Patent Number: 5,909,644
[45] Date of Patent: Jun. 1, 1999

[54] AM RADIO RECEIVER

[75] Inventor: Hitoshi Tomiyama, Kanagawa, Japan

[73] Assignee: Sony Corporation, Tokyo, Japan

[21] Appl. No.: 08/764,395

[22] Filed: Dec. 11, 1996

[30] Foreign Application Priority Data

Dec. 19, 1995 [JP] Japan ............................. P 7-348737

[51] Int. Cl.$^6$ ................................................. H04B 17/02
[52] U.S. Cl. ........................................... 455/146; 455/131
[58] Field of Search .............................. 455/76, 131, 142, 455/146, 147, 150.1, 161.1, 188.1

[56] References Cited

U.S. PATENT DOCUMENTS

| 2,586,894 | 2/1952 | Williams et al. | 455/146 |
| 5,519,885 | 5/1996 | Vaisanen | 455/76 |

FOREIGN PATENT DOCUMENTS

| 0305604 | 3/1989 | European Pat. Off. | H03D 7/16 |

*Primary Examiner*—Nguyen Vo
*Assistant Examiner*—Marsha D. Banks-Harold
*Attorney, Agent, or Firm*—Jay H. Maioli

[57] ABSTRACT

An AM radio receiver of a double superheterodyne type. Where a first intermediate frequency is selected to be a low frequency of several kHz other than 0 kHz. A second intermediate frequency is selected to be several tens of kHz. A first local oscillator circuit formed of a PLL generates first local oscillation signals of two kinds whose phases are different from each other by 90°. First and second mixer circuits are respectively supplied with the first local oscillation signals of two kinds and mix them with a received signals to generate the first intermediate frequency. First and second filters obtain signals each having the first intermediate frequency. A second local oscillator circuit generates second local oscillation signals of two kinds whose phases are different from each other by 90°. Third and fourth mixer circuits are respectively supplied with the signals having the first intermediate frequency and mix them with the second local oscillation signals. An adding circuit adds both signals output from the third and fourth mixer circuits. A third filter is supplied with a signal from the adding circuit and obtains a signal having a second intermediate frequency. Then, an AM detecting circuit detects an amplitude of the signal having the second intermediate frequency to obtain an audio signal. The AM radio receiver has an IC incorporating an intermediate-frequency selecting device which operates as described above.

4 Claims, 5 Drawing Sheets

AM RADIO RECEIVER

BACKGROUND OF THE INVENTION

1. Field of the Invention

The present invention relates to an AM radio receiver apparatus of a digital tuning system employing a phase locked loop (PLL).

2. Description of the Related Art

A superheterodyne radio receiver apparatus is arranged as follows.

Specifically, a broadcasting wave is received by an antenna to obtain a weak signal. The weak signal is amplified by a high-frequency amplifier. A mixer circuit mixes the amplified signal with a local oscillation signal to obtain an intermediate-frequency signal. Since an output signal from the mixer circuit contains a signal component other than the intermediate-frequency signal, an intermediate-frequency selecting device (filter) selects only the intermediate-frequency signal from the output signal from the mixer circuit. An intermediate-frequency amplifier amplifies the intermediate frequency signal. An AM detecting circuit detects the amplified intermediate-frequency signal to obtain an audio signal component.

Since a difference between a reception frequency and a frequency of a local oscillation signal is an intermediate frequency in this case, a reception frequency is determined by changing a value of the local oscillation frequency. This operation of changing the value of the reception frequency is called the tuning.

A tuning system of a radio receiver apparatus includes an analog tuning system and a digital tuning system. The analog tuning system employs a variable capacitor. When a tuning dial is rotated, a local oscillation frequency is continuously changed, thereby a desired reception frequency being selected.

The digital tuning system has a local oscillator circuit formed of a phase locked loop (PLL). When a frequency dividing ratio N of a variable frequency divider forming a part of the PLL is changed, in case of an AM radio receiver, for example, a local oscillation frequency is changed stepwise at an interval of 9 kHz or 10 KHz to thereby change a reception frequency, whereby a desired broadcasting frequency is selected. The above frequency dividing ratio N is given by a microcomputer, for example.

When the digital tuning system is employed, if the frequency dividing ratio N used for obtaining the local oscillation frequency used when the mixer circuit converts a reception frequency of a desired broadcasting station into an intermediate frequency is previously set in a memory so as to correspond to a button of a radio receiver, then it is possible to select the broadcasting of the desired reception frequency only by pressing the button. Since a fine adjustment carried out by using the tuning dial in the analog tuning system is not necessary, this facilitate a user's operation. Moreover, a radio receiver employing the digital tuning system is easily formed of ICs.

Therefore, most of recent radio receivers employ the digital tuning system employing the PLL rather than the analog tuning system.

In the digital tuning system, the intermediate frequency must have a fixed value. However, if a selection characteristic of the intermediate-frequency selecting device (filter) is fluctuated (i.e., a center frequency of a pass bandwidth of a filter is fluctuated), then the intermediate frequency is fluctuated. Moreover, since the difference between the reception frequency and the local oscillation frequency is the intermediate frequency, the fluctuation of the intermediate frequency leads to fluctuation of the reception frequency.

When the radio receiver employs the analog tuning system, the local oscillation frequency can be continuously changed as described above. Therefore, even if the reception frequency is fluctuated by several kHz due to the fluctuation of the intermediate frequency, then it is sufficient to finely adjust the reception frequency by using the tuning dial.

However, when the radio receiver employs the digital tuning system, the reception frequency is changed stepwise at an interval of 9 kHz or 10 kHz as described above. Therefore, if the reception frequency is fluctuated by several KHz, then the broadcasting of the desired broadcasting station may be prevented from being received.

Specifically, if the intermediate-frequency selecting device is formed of an active filter formed of a capacitor and a resistor in an IC, then when a resistance value is fluctuated by about 20%, a frequency of a pass bandwidth of the active filter formed in the IC is also fluctuated to that extent.

If the intermediate frequency is selected to be a frequency smaller than 100 kHz, e.g., 50 kHz for comparatively reducing the number of steps of the filter and the number of elements thereof, then when a center frequency of a pass bandwidth of the intermediate-frequency selecting device (filter) is fluctuated by about 10 KHz, the broadcasting of the desired broadcasting station cannot be received. In general, when an IC is manufactured normally, a resistance element of the IC is fluctuated by ±20% within a dispersion error range. Therefore, in practice, upon a circuit design of an IC, the values are previously set on the assumption of the dispersion error of about 20%.

In order to avoid such disadvantageous fluctuation of the intermediate frequency, the conventional radio receiver of the digital tuning system has employed a ceramic filter as a filter for selecting an intermediate frequency.

However, the ceramic filter must be attached to the IC from the IC, which increases the number of connection terminals of the IC and prevents the IC from being downsized. Moreover, the ceramic filter is expensive and is a large-size part, which substantially prevents the radio receiver from being made thinner and smaller.

SUMMARY OF THE INVENTION

In view of such problems, it is an object of the present invention to provide an AM radio receiver employing a digital tuning system in which, even if an intermediate-frequency selecting device is formed of a capacitor and a resistor incorporated in an IC, it is possible to reliably select a desired broadcasting station without a reception frequency being fluctuated.

According to an aspect of the present invention, an AM radio receiver includes a first local oscillator circuit which has an oscillator formed of a phase locked loop and outputs first local oscillation signals of two kinds whose phases are different from each other by 90°, a first mixer circuit supplied with one of the first local oscillation signals from the first local oscillator circuit and a received signal, a second mixer circuit supplied with the other of the first local oscillation signals from the first local oscillator circuit and the received signal, a first filter for deriving a signal having a first intermediate frequency from a signal output from the first mixer circuit, a second filter for deriving a signal having the first intermediate frequency from a signal output from the second mixer circuit, third and fourth mixer circuits respectively supplied with the signals having the first intermediate frequency from the first and second filters, a second local oscillator circuit for supplying to the third and fourth mixer circuits second local oscillation signals of two kinds whose phases are different from each other by 90°, an adding circuit for adding signals output from the third and fourth mixer circuits, a third filter for obtaining a signal having a second intermediate frequency from a signal output from the adding circuit, an intermediate-frequency amplifier circuit for amplifying the signal having the second intermediate frequency from the third filter, and an AM detecting circuit for detecting an amplitude of a signal output from the intermediate-frequency amplifying circuit to obtain an audio signal. The first intermediate frequency is set to a low frequency (except 0) so that fluctuations of center frequencies of pass bandwidths of the first and second filters should be limited within a bandwidth smaller than a half of a frequency by which a reception frequency is changed stepwise.

According to the AM radio receiver of the present invention having the above arrangement, since the first intermediate frequency is set to a low frequency which does not exceed a half of an interval at which a reception frequency is changed stepwise, e.g., a several kHz, even if the center frequencies of pass-bandwidths of the first and second filters are fluctuated, then the fluctuation ranges become smaller, which enables a broadcasting of a desired broadcasting station to be reliably received.

Indeed, the low first intermediate frequency may cause an image interference. However, according to the AM radio receiver of the present invention, the first and second mixer circuits used to obtain the first intermediate frequency mix the received signal with the first oscillation signals whose phases have orthogonal relationship therebetween. The third and fourth mixer circuits used to obtain the second intermediate frequency mix the signals having the first intermediate frequency with the second oscillation signals whose phases have orthogonal relationship therebetween. Moreover, the adding circuit adds the signals output from the third and fourth mixer circuits. Therefore, the AM radio receiver according to the present invention is arranged such that the image interference seldom occurs.

A concept of reducing the image interference with a similar arrangement in an FM radio receiver has already been disclosed in some publications such as Japanese patent publication No. 196629/1984 published on Nov. 8, 1984, Japanese patent publication No. 111471/1995 published on Apr. 25, 1995.

DESCRIPTION OF THE PREFERRED EMBODIMENT

An AM radio receiver according to an embodiment of the present invention will hereinafter be described with reference to the accompanying drawings.

Figure 1:
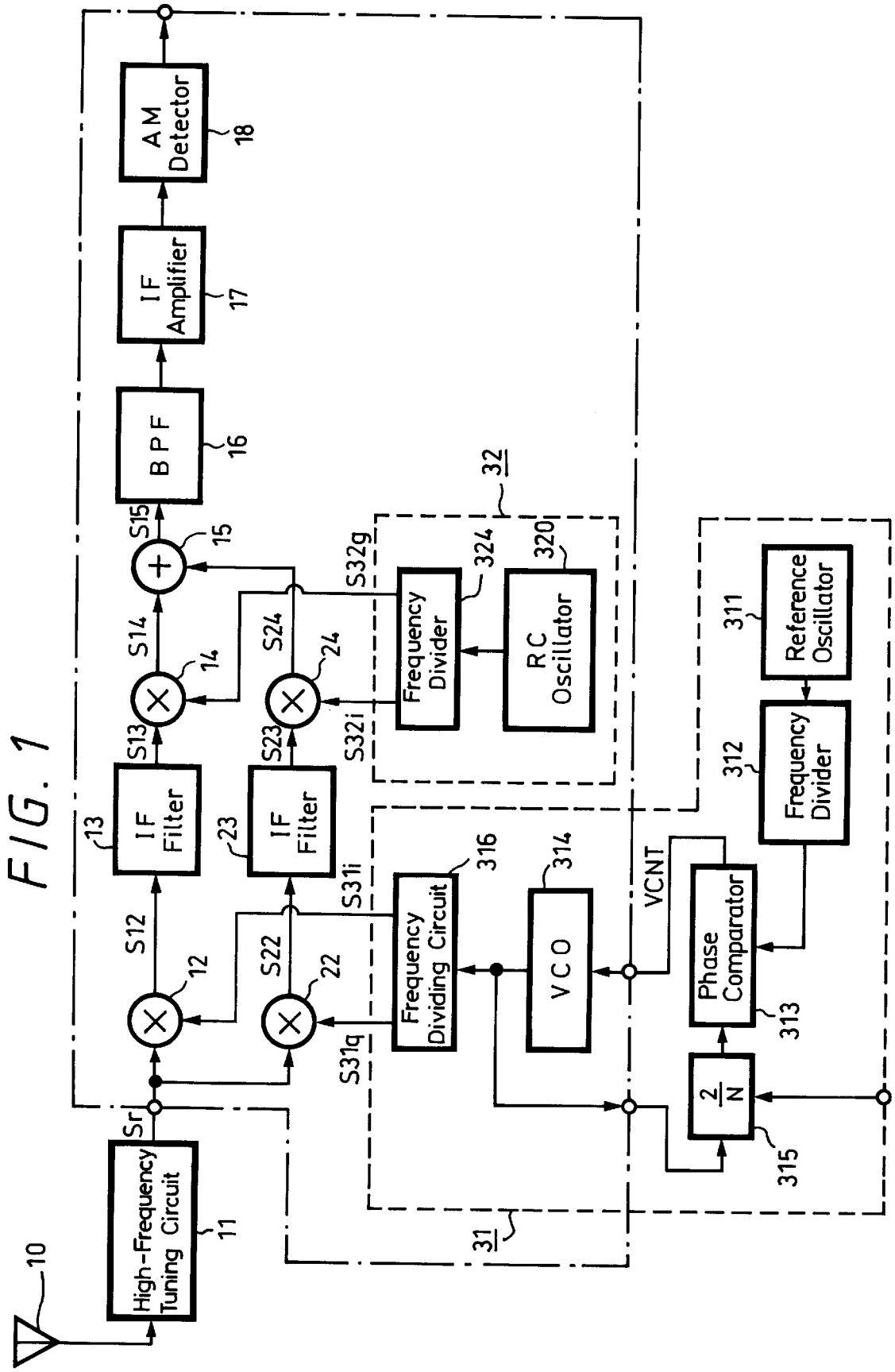
FIG. 1 is a block diagram showing a main part of an AM radio receiver according to an embodiment of the present invention.

FIG. 1 is a block diagram showing a main part of the AM radio receiver according to the embodiment. In FIG. 1, a portion surrounded by a one-dot chain line depicts an IC.

The AM radio receiver according to this embodiment employs a double superheterodyne system when reception frequencies are set stepwise at an interval of 9 kHz. According to the AM radio receiver, a first intermediate frequency is selected so as to be a frequency smaller than 4.5 kHz, e.g., several kHz, and a second intermediate frequency is selected so as to be a frequency smaller than 100 kHz. Thus, the AM radio receiver is arranged so as to suppress fluctuation of the reception frequencies within a range of about 1 kHz even if the characteristics of the ICs are not constant. In the embodiment described below, the first intermediate frequency is set to 3 kHz and the second intermediate frequency is set to 50 kHz.

Specifically, a received signal Sr received by an antenna 10 provided outside the IC is supplied through a high-frequency tuning circuit 11 to first and second mixer circuits 12, 22.

A first local oscillator circuit 31 generates first local oscillation signals S31$i$ and S31$q$ whose phases are different by 90° from each other. The first local oscillation signal S31$i$ is supplied to the first mixer circuit 12, and the first local oscillation signal S31$q$ is supplied to the second mixer circuit 22, respectively.

The first local oscillator circuit 31 is formed of a phase locked loop (PLL). In this embodiment, while a variable frequency oscillator (voltage-controlled oscillator) 314 and the frequency dividing circuit 316 are provided in an IC, other parts and units forming the PLL are formed as external parts or formed in an external IC.

In the first local oscillator circuit 31, a highly accurate reference oscillator 311 employing a quartz oscillator, for example, generates an oscillation output signal and supplies it to a frequency divider 312. The frequency divider 312 supplies its output signal to a phase comparator circuit 313. The variable frequency oscillator 314 outputs a signal to a variable frequency dividing circuit 315. The variable frequency divider 315 converts its frequency and outputs a signal to the phase comparator circuit 313.

The variable frequency dividing circuit 315 is supplied with information used for determining a frequency division ratio from a microcomputer, for example. The frequency division ratio of the variable frequency dividing circuit 315 corresponds to the reception frequency as described above.

The phase comparator circuit 313 compares phases of two input signals and outputs an error voltage VCNT used for setting frequencies of both of the input signals equal to each other and matching phases thereof with each other. The error voltage VCNT is supplied to a varicap (not shown) for determining a frequency of a signal output from the variable frequency oscillator 314. The varicap is provided outside the IC.

The variable frequency oscillator 314 outputs a signal having the set frequency to the frequency dividing circuit 316. The frequency dividing circuit 316 divides its frequency. The frequency dividing circuit 316 outputs the first local oscillation signals S31$i$, S31$q$ having the same frequency and the phases different from each other by 90°.

In this case, when the frequency dividing ratio of the variable frequency dividing circuit 316 is changed at one step, the frequencies of the first local oscillation signals S31$i$, S31$q$ are changed by 9 kHz which is an interval used when the reception frequency is changed stepwise in the digital tuning system as described above. In this embodiment, the first local oscillation signals S31$i$, S31$q$ are set so as to have frequencies different from the reception frequency, which is to be selected, by 3 kHz.

The first and second mixer circuits 12, 22 respectively mix the received signal Sr from the high-frequency tuning circuit 11 with the first local oscillation signals S31$i$, S31$q$ to obtain signals S12, S22 whose phases are different from each other by 90° and whose frequencies are a first intermediate frequency obtained by converting the received signal Sr to be selected.

The first and second mixer circuits 12, 22 respectively supply the signals S12, S22 to first intermediate-frequency filters 13, 23. The first intermediate-frequency filters 13, 23 respectively obtain signals S13, S23 having the first intermediate frequency of the received signal to be selected. In this case, since the first intermediate frequency is 3 kHz, the first intermediate-frequency filters 13, 23 are low-pass filters which have cut-off frequencies of 6 kHz and which are formed as active filters each formed of a resistor and a capacitor in the IC.

The first intermediate-frequency filters 13, 23 output signals S13, S23 to third and fourth mixer circuits 14, 24, respectively.

A second local oscillation circuit 32 is formed of an oscillator 320 having a fixed frequency and a frequency divider circuit 324. All components forming the oscillator 320 are provided in the IC. The oscillator 320 is arranged as a resistance-capacitance (RC) oscillator whose characteristics are determined depending upon a resistor, a capacitor and a temperature characteristics of the IC and prevented from being affected by uneven characteristics of transistors. The oscillator 320 will be described in detail later on.

As shown in FIG. 1, in the second local oscillator circuit 32, the frequency divider circuit 324 is supplied with an oscillation signal from the oscillator 320. The frequency divider circuit 324 generates second local oscillation signals S32$i$, S32$q$ having a frequency of 47 kHz and phases different from each other by 90°, and supplies them to the third and fourth mixer circuits 14, 24, respectively.

The third and fourth mixer circuits 14, 24 respectively mix the second local oscillation signals S32$q$, S32$i$ with the signals S13, S23 to obtain signals S14, S24 having a second intermediate frequency of 50 kHz. The signals S14, S24 having the second intermediate frequency are respectively supplied from the third and fourth mixer circuits 14, 24 to an adding circuit 15. The adding circuit 15 adds the signals S14 and S24. The adding circuit 15 outputs a signal S15 to a second intermediate-frequency filter 16. The second intermediate-frequency filter 16 is a band-pass filter in which a center frequency of a pass bandwidth is 50 kHz. The second intermediate-frequency filter 16 is formed as an active filter formed of a resistor and a capacitor in the IC.

The second intermediate-frequency filter 16 outputs a processed signal to an intermediate-frequency amplifier circuit 17. The intermediate-frequency amplifier circuit 17 amplifies the signal and supplies it to an amplitude-modulation (AM) detecting circuit 18. The AM detecting circuit 18 demodulates a supplied signal to obtain an audio signal.

Subsequently, an operation of obtaining the second intermediate-frequency signal in the double superheterodyne AM radio receiver according to this embodiment will be described in detail with reference to equations.

Figure 2A:
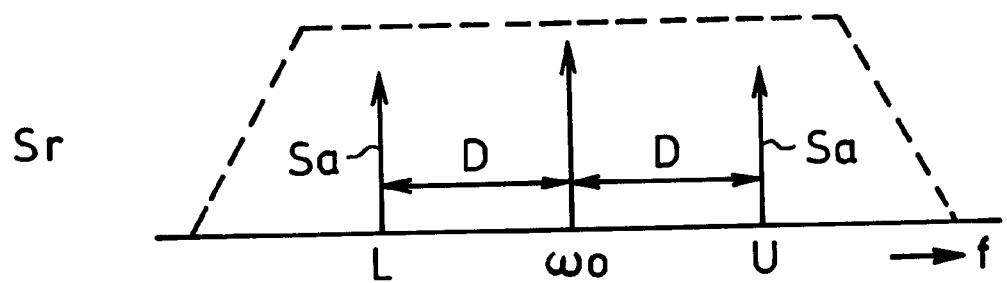
FIGS. 2A and 2B are diagrams showing amplitudes of signals respectively obtained before and after the signals are processed by the main part of the AM radio receiver according to the embodiment.

In this case, for simplifying the explanation, it is assumed that, as shown in FIG. 2A, the received signal Sr has signal components Sa in its bandwidths of upper and lower side bands departed from its carrier frequency by a frequency D and that symbols $\omega o$, Eo and Ea respectively depict a carrier frequency (angular frequency) of the received signal Sr, a carrier amplitude of the received signal Sr, and an amplitude of the signal component departed from the carrier frequency by the frequency D. Then, the following equation is established:

$$Sr = Eo \cdot \sin \omega o t + Ea \{\sin(\omega o - D)t + \sin(\omega o + D)t\}$$

Assuming that $$L = \omega o - D \text{ and}$$

$$U = \omega o + D,$$

then the above equation can be replaced with the following equation:

$$Sr = Eo \cdot \sin \omega o t + Ea (\sin Lt + \sin Ut).$$

Assuming that symbols E1 and $\omega c$ respectively depict an amplitude of the first local oscillation signals S31$i$, S31$q$ and the first local oscillation frequency, then the following equations are obtained:

$$S31i = E1 \cdot \sin \omega c t$$

$$S31q = E1 \cdot \cos \omega c t$$

$$\omega c = \omega o + \omega i$$

$$\omega i = 2\pi fi$$

(where fi depicts the first intermediate frequency and fi=3 kHz is established)

Accordingly, the respective output signals S12, S22 of the first and second mixer circuits 12, 22 are expressed as follows.

$$\begin{aligned}
S12 &= Sr \cdot S31i \\
&= (Eo \cdot \sin \omega o t + Ea \cdot \sin Lt + Ea \cdot \sin Ut) \times E1 \cdot \sin \omega c t \\
&= \alpha c\{-\cos(\omega o + \omega c)t + \cos(\omega c - \omega o)t\} + \\
&\quad \alpha a\{-\cos(L + \omega c)t + \cos(\omega c - L)t\} + \\
&\quad \alpha a\{-\cos(U + \omega c)t + \cos(U - \omega o)t\} \\
&= \alpha c\{-\cos(\omega o + \omega c)t + \cos \omega i t\} + \\
&\quad \alpha a\{-\cos(L + \omega c)t + \cos(\omega c - L)t\} + \\
&\quad \alpha a\{-\cos(U + \omega c)t + \cos(U - \omega o)t\}
\end{aligned}$$

$$\begin{aligned}
S22 &= Sr \cdot S31q \\
&= (Eo \cdot \sin \omega o t + Ea \cdot \sin Lt + Ea \cdot \sin Ut) \times E1 \cdot \cos \omega c t \\
&= \alpha c\{\sin(\omega o + \omega c)t - \sin(\omega c - \omega o)t\} + \\
&\quad \alpha a\{\sin(L + \omega c)t - \sin(\omega c - L)t\} + \\
&\quad \alpha a\{\sin(U + \omega c)t + \sin(U - \omega o)t\} \\
&= \alpha c\{\sin(\omega o + \omega c)t - \sin \omega i t\} + \\
&\quad \alpha a\{\sin(L + \omega c)t - \sin(\omega c - L)t\} + \\
&\quad \alpha a\{\sin(U + \omega c)t + \sin(U - \omega o)t\}
\end{aligned}$$

where $\alpha c = Eo \cdot E\frac{1}{2}$ and $\alpha a = Ea \cdot E\frac{1}{2}$.

Since these signals S12, S22 are supplied to the first intermediate-frequency filters (low-pass filters) 13, 23, the first intermediate-frequency signals S13, S23 derived from the first intermediate-frequency filters 13, 23 are as follows.

$$S13 = \alpha c \cdot \cos \omega it + \alpha a \cdot \cos(\omega c - L)t + \alpha a \cdot \cos(U - \omega t)t$$

$$S23 = -\alpha c \cdot \sin \omega it - \alpha a \cdot \sin(\omega c - L)t + \alpha a \cdot \sin(U - \omega t)t$$

These signals S13, S23 are further supplied to the third and fourth mixer circuits 14, 24. Accordingly, if $$S32i = E2 \cdot \sin \omega st, \text{ and}$$

$$S32q = E2 \cdot \cos \omega st$$

are established (wherein E2 depicts an amplitude of the second local oscillation signals S32$i$, S32$q$ and $\omega s = 2\pi fs$ (fs=47 kHz) and $\omega I = \omega s + \omega i = 2\pi fI$ (fI is the second intermediate frequency satisfying fI=50 kHz) are established, then the following equations are established:

$$S14 = S13 \cdot S23q$$

$$= \{\alpha c \cdot \cos \omega it + \alpha a \cdot \cos(\omega c - L)t + \alpha a \cdot \cos(U - \omega c)t\} \times$$

$$E2 \cdot \cos \omega st$$

$$= \beta c\{\cos(\omega i + \omega s)t + \cos(\omega i - \omega s)t\} +$$

$$\beta a\{\cos(\omega c + \omega s - L)t - \cos(\omega c - \omega s - L)t\} +$$

$$\beta a\{\cos(U - \omega c + \omega s)t - \cos(U - \omega c - \omega s)t\}$$

and $$S24 = S23 \cdot S32i$$

$$= \{-\alpha c \cdot \sin \omega it - \alpha a \cdot \sin(\omega c - L)t + \alpha a \cdot \sin(U - \omega c)t\} \times$$

$$E2 \cdot \sin \omega st$$

$$= \beta c\{\cos(\omega i + \omega s)t - \cos(\omega i - \omega s)t\} +$$

$$\beta a\{\cos(\omega c + \omega s - L)t - \cos(\omega c - \omega s - L)t\} +$$

$$\beta a\{\cos(U - \omega c - \omega s)t - \cos(U - \omega c - \omega s)t\}$$

where $\beta c = \alpha c \cdot E2/2$ and $\beta a = \alpha a \cdot E2/2$

The signals S14, S24 are supplied to the adding circuit 15, and the adding circuit 15 adds the signals S14, S24 to obtain the following signal S15.

$$S15 = S14 + S24$$

$$= 2\beta c \cdot \cos(\omega i + \omega s)t + 2\beta a\{\cos(\omega c + \omega s - L)t +$$

$$\cos(U - \omega c - \omega s)t\}$$

In consideration of $$L = \omega o - D,$$

$$U = \omega o + D,$$

$$\omega c = \omega o + \omega i, \text{ and}$$

$$\omega I = \omega s + \omega i,$$

the signal S15 can be expressed as follows $$S15 = 2 \beta c \cdot \cos \omega It + 2\beta a \{\cos (\omega I + D)t + \cos (\omega I - D)t\}$$

Figure 2B:
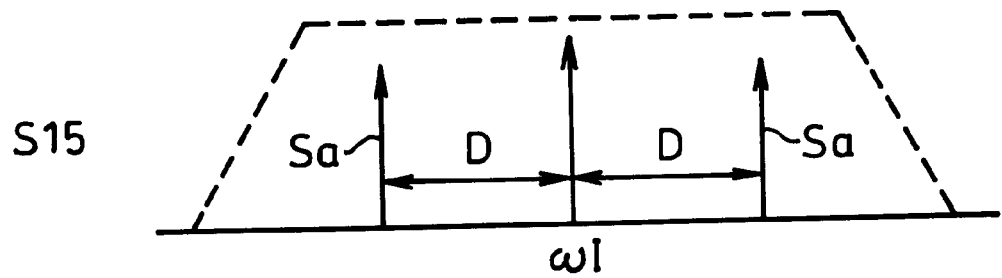

FIG. 2B shows the signal S15. As shown in FIG. 2B, the signal S15 is a signal obtained when the received signal Sr is frequency converted to a signal of a carrier frequency (angular frequency) $\omega I$. Specifically, the signal S15 is the second intermediate frequency signal having the intermediate frequency fI.

Therefore, this signal S15 having the second intermediate frequency is supplied through the band-pass filter 16 for the intermediate frequency and the intermediate-frequency amplifier circuit 17 to the AM detecting circuit 18. Thus, the received signal is demodulated, thereby the audio signal being obtained.

Since the AM receiver according to this embodiment employs the above double superheterodyne system and the above orthogonal transformation, even if the first intermediate frequency is set to a low frequency of several kHz, then it is possible to avoid an adjacent-image interference. Specifically, through an image interference component is not described in the above equations, the two-step orthogonal transformation provides the image interference components having two opposite phases, thereby the image interference components being removed by the addition processing of the adding circuit 15.

The second local oscillation signal input to the third and fourth mixer circuits 14, 24 has a frequency of 47 kHz, but the center frequency of the pass bandwidth of the bandpass filter 16 is 50 kHz. If this difference permits the second local oscillation signal to leak to the output sides of the third and fourth mixer circuits 14, 24, then the leakage components cannot be removed by the band-pass filter 16, thereby becoming a beat when the AM broadcasting is received.

In this embodiment, the third and fourth mixer circuits 14, 24 are arranged as follows, though not described in detail. Specifically, these third and fourth mixer circuits 14, 24 are arranged as those of balanced modulation type. Moreover, the leakage component of the second local oscillation signal is detected by synchronous detection on the output sides of the third and fourth mixer circuits 14, 24, and a DC bias potential of a transistor forming a balanced-modulator circuit each of the mixer circuits is controlled in response to the detected outputs, thereby a negative feedback being effected so that the imbalance should be corrected.

The negative feedback circuits of the third and fourth mixer circuits 14, 24 prevent the third and fourth mixer circuits 14, 24 from converting components having a frequency approximate to 0 Hz from the low-pass filters 13, 23, thereby such components being not supplied on the output sides of the third and fourth mixer circuits 14, 24. Therefore, if the first intermediate frequency is set to 0 Hz in the reception system for receiving the AM radio broadcasting wave, then the carrier component is not transformed by the third and fourth mixer circuits 14, 24, thereby a signal necessary for effecting an automatic gain control (AGC) is not obtained.

As described above, such system allowing the first intermediate frequency to become 0 Hz is not suitable for reception of the AM radio broadcasting wave. The first intermediate frequency must be set to a frequency which is larger than 0 Hz and whose carrier component is not canceled by the negative feedback circuits of the third and fourth mixer circuits 14, 24. The first intermediate frequency of 3 kHz employed in this embodiment satisfies the above conditions.

In this embodiment, as will be described later on, the second local oscillator circuit 32 is formed in the IC and arranged such that its oscillation frequency is determined by a resistance value and a capacitance in the IC. The second intermediate-frequency filter 16 is formed as an active filter formed of a resistor and a capacitor in the same IC. Therefore, if the resistances value of the ICs is fluctuated due to the uneven characteristic of the IC, then resistance values of the second local oscillator circuit 32 and the second intermediate-frequency filter 16 are changed at the same proportion, thereby the second local oscillation frequency and the center frequency of the pass bandwidth of the second intermediate-frequency filter 16 being fluctuated at the same proportion. Therefore, the uneven characteristics of the second local oscillator circuit 32 and the second intermediate-frequency filter 16 seldom influence the reception frequency.

The first local oscillator circuit 31 is formed of the PLL and its characteristic is determined by a frequency accuracy of a reference oscillator forming the PLL. On the other hand, since being formed of resistors and capacitors in the IC, the first intermediate-frequency filters 13, 23 are influenced by the uneven characteristics of the ICs. Accordingly, when the reception frequency is fluctuated due to the uneven characteristics of the ICs of the AM radio receiver according to this embodiment, it is sufficient to consider only the uneven characteristics of the first intermediate-frequency filters 13, 23. If the resistance values of the IC is fluctuated by ±20% due to the uneven characteristic of the IC, then the center frequencies of the pass bandwidths of the first intermediate-frequency filters 13, 23 are also fluctuated by ±20%. Therefore, since the first intermediate frequency is 3 kHz, the reception frequency is fluctuated by ±600 Hz.

Since the reception frequency is changed stepwise at an interval of 9 kHz or 10 kHz in the digital tuning system as described above, a desired broadcasting is prevented from being not received if the fluctuation of the reception frequency is smaller than a half of the interval at which the reception frequency is changed stepwise. Therefore, if the fluctuation of the reception frequency is smaller than 4.5 kHz or 5 kHz, then it is possible to prevent the desired broadcasting from being not received.

According to this embodiment, as described above, since the fluctuation of the reception frequency is smaller than 1 kHz, it is possible to reliably receive the desired broadcasting.

Figure 3:
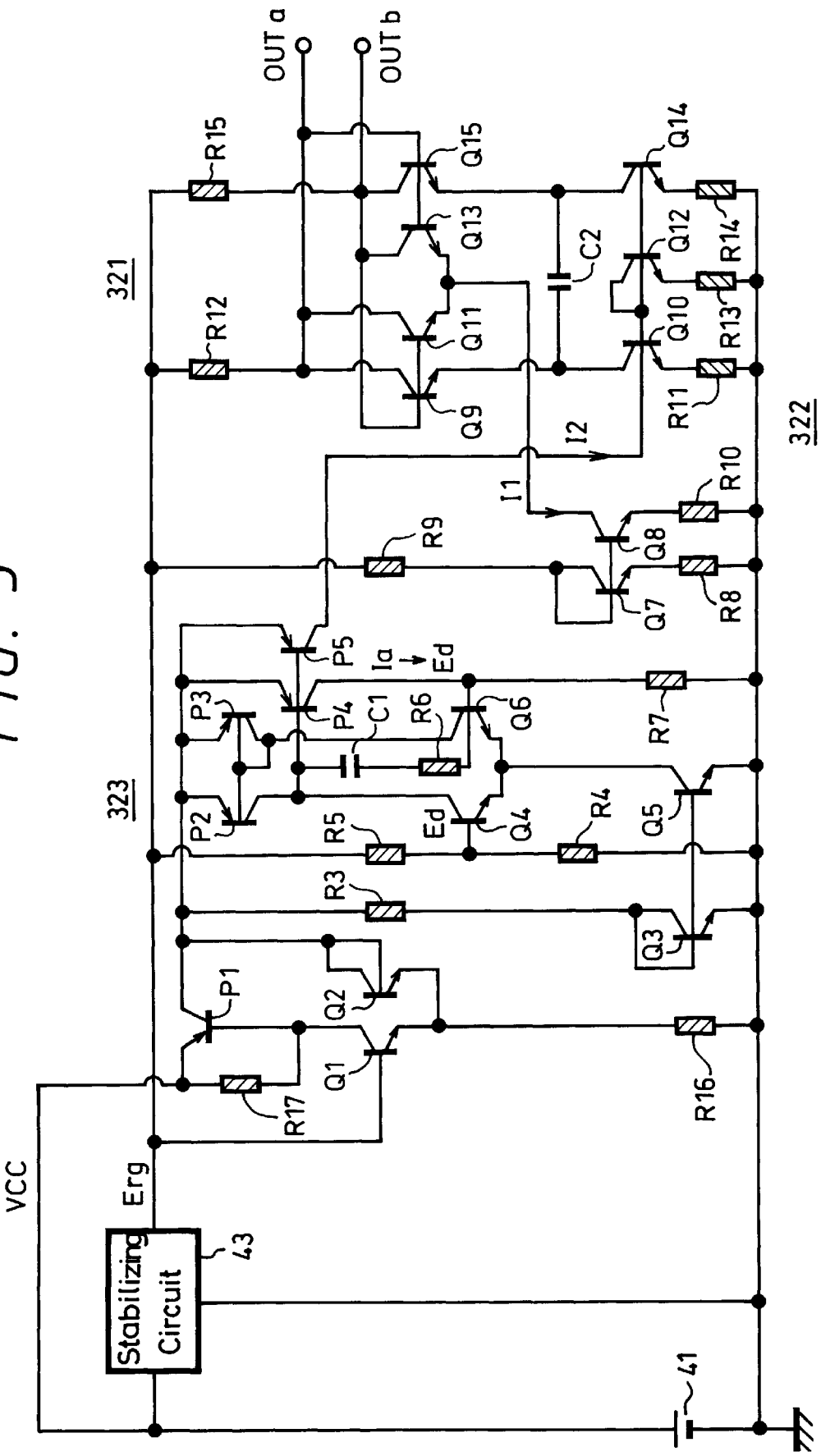
FIG. 3 is a diagram showing a specific circuit arrangement of a second local oscillator circuit of the AM radio receiver according to the embodiment.
Figure 4:
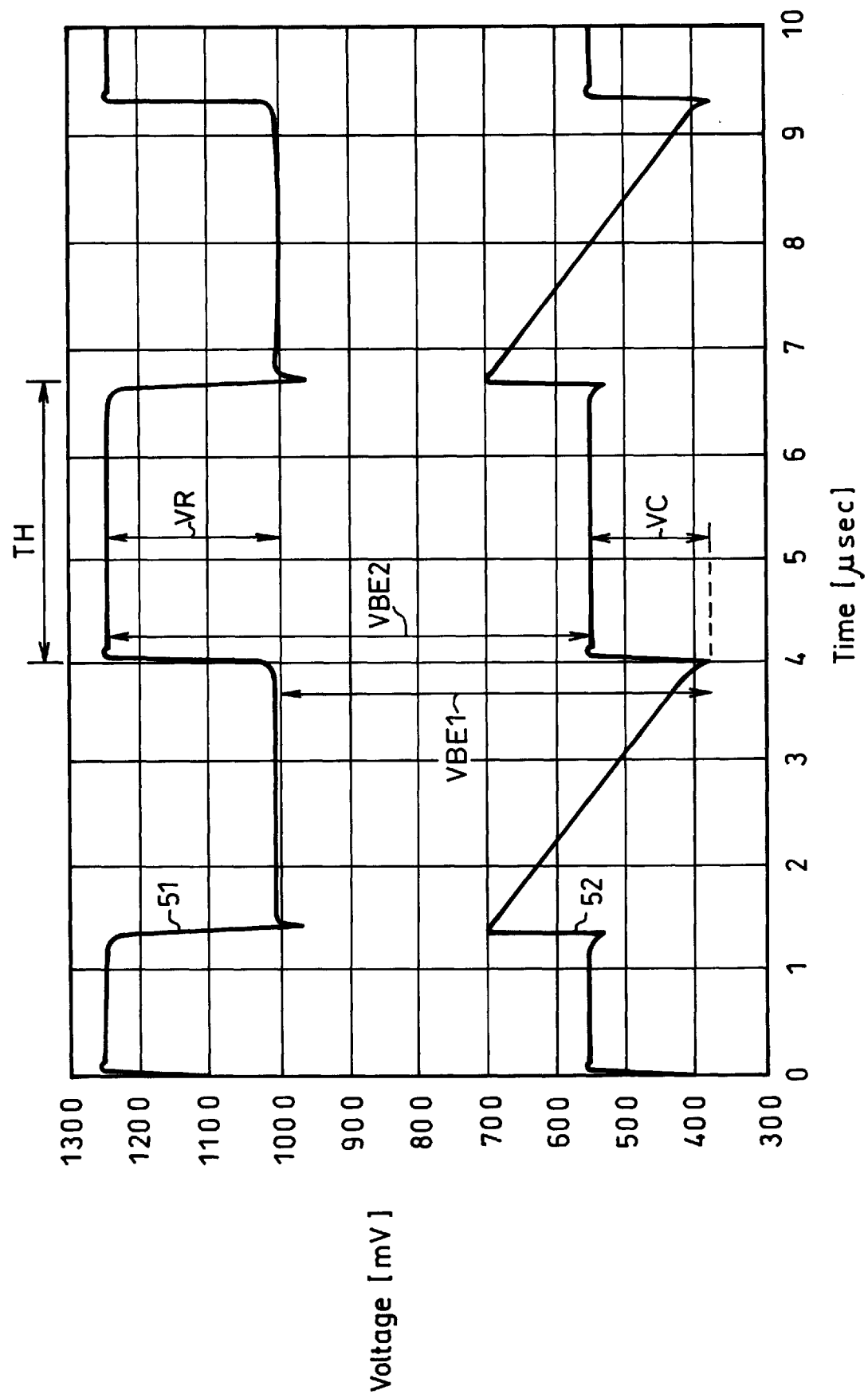
FIG. 4 is a graph showing waveforms of the signals generated by the second local oscillator circuit.

Subsequently, a specific arrangement of the second local oscillator circuit 32 according to this embodiment will be described by way of example. FIG. 3 is a diagram showing a circuit arrangement of the second local oscillator circuit 32 according to this embodiment. FIG. 4 is a graph showing a waveform and used to explain an operation of a main part thereof.

As shown in FIG. 3, the second local oscillator circuit 32 is mainly formed of an oscillator 321, a current source 322 for operating the oscillator 321, and a current generator unit 323 for generating a current I2 to be supplied to the current source 322.

The second local oscillator circuit 32 includes a voltage source 41 for supplying a DC voltage Vcc of 2 V, for example. The voltage source 41 is connected to an emitter of a transistor P1 and to a stabilizing circuit 43. The stabilizing circuit 43 supplies a stabilized voltage Erg.

The stabilized voltage Erg is supplied to a base of a transistor Q1. An emitter of the transistor Q1 is grounded through a resistor R16. The emitter of the transistor P1 is connected to a base thereof through a resistor R17. A connection point of the resistor R17 and the base of the transistor P1 is connected to a collector of the transistor Q1. An emitter of a transistor Q2 is connected to the emitter of the transistor Q1. A base of the transistor Q2 and a collector thereof are connected to each other, and a connection point therebetween is connected to a collector of the transistor P1.

In this case, the stabilized power source voltage Erg from the stabilizing circuit 43 has the same temperature characteristic as that of a band gap reference. The band gap reference is a sum of a voltage VBE across a base and an emitter of a transistor having a negative temperature characteristic and a voltage proportional to kT/q having a positive temperature characteristic (where k is a Boltzmann constant, T is an absolute temperature, and q is a charge amount of an electron). This embodiment is characterized in that temperature fluctuation of the stabilized power source voltage Erg is limited in the narrow range by setting the voltage Erg to about 1.25 V.

Figure 5:
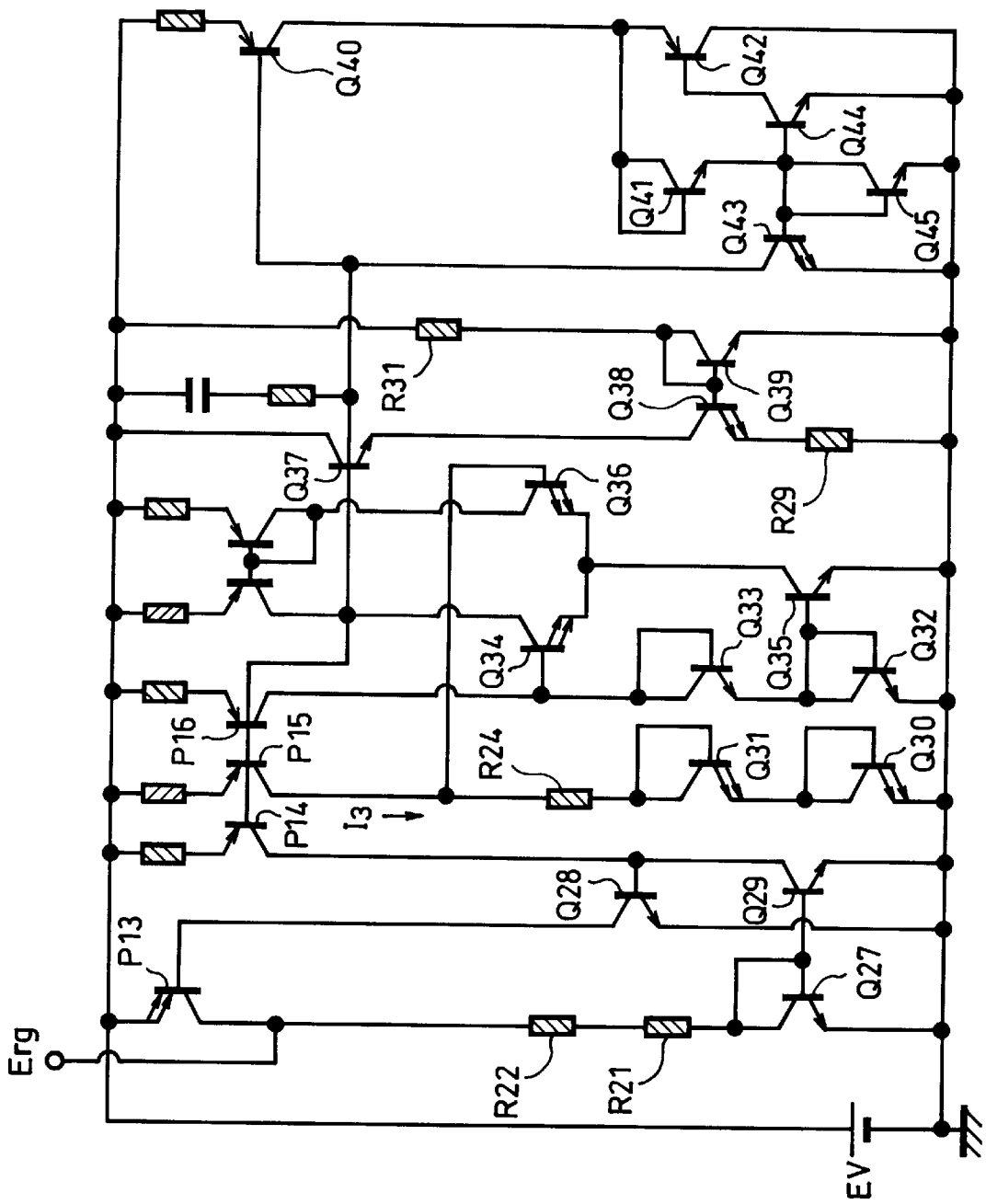
FIG. 5 is a diagram showing a specific circuit arrangement of a stabilizing circuit of the second local oscillator circuit.

FIG. 5 is diagram showing arrangements of the stabilizing circuit 43 for supplying the stabilized power source voltage of 1.25 V and its peripheral circuits by way of example. Schematic arrangement and operation of the stabilizing circuit 43 and the peripheral circuits will be described.

A serial circuit formed of a resistor R31 and a diode-connected transistor Q39 is applied with a DC voltage EV from the power source 41. Then, a current corresponding to a resistance value of the resistor R31 flows through the transistor Q39. The same current flows through a transistor Q38 forming a current mirror together with the transistor Q39, thereby a transistor Q37 being set in its on-state. Therefore, a base current from the transistor Q37 flows through transistors P14 to P16. The transistors P14 to P16 start operating, thereby a base current flowing through transistors Q34, Q36 forming a differential amplifier.

A difference component between the base potentials of the transistors Q34, Q36 is obtained on the collector side of the transistor Q34. Then, the current I3 flowing through the transistors P14 to P16 is changed, thereby a voltage across both ends of a resistor R24 is changed. As a result, the base potentials of the transistors Q34, Q36 become equal to each other.

Transistors Q40 to Q45 form a circuit used for collecting an excess current of the base current which flows from the transistors P14 to P16 to the transistor Q34, and hence may be removed if necessary.

Thus, the current I3 flowing through the transistors P14 to P16 has a constant value which allows the base potentials of the transistors Q34, Q36 to be equal to each other. At this time, a voltage whose value is an integral multiple of kT/q (26 mV at room temperature) is obtained across the resistor R24. Therefore, the constant current I3 proportional to kT/q flows through the transistors P14 to P16.

The current I3 flowing through the transistor P14 sets a transistor Q28 in its on-state, thereby the transistor P13 is set in its on-state. As a result, the same current as the current I3 flows through a transistor P13, resistors R22, R21 and a transistor Q27, thereby the stabilized voltage Erg of 1.25 V being obtained at a connection point between a collector of the transistor P13 and the resistor R22.

The stabilized voltage Erg is proportional to the current I3, the resistors R22, R21 and a voltage VBE between a base and an emitter of a diode-connected transistor Q27. The stabilized voltage Erg has the same temperature characteristic as the above band gap reference. Moreover, since the stabilized voltage Erg is set to 1.25 V as described above, the voltage Erg is hardly influenced by temperature change.

Returning to FIG. 3, the oscillator 321 fundamentally is an astable multivibrator type and formed of transistors Q9, Q11, Q13, Q15, resistors R12, R15, and a capacitor C2. Specifically, the oscillator 321 is arranged as a so-called resistor-capacitor (RC) oscillator which oscillates by resonance of a resistor and a capacitor.

Specifically, the capacitor C2 is connected between emitters of the transistors Q9, Q15. A collector of the transistor Q9 is connected to a base of the transistor Q15 and also connected through the resistor R12 to an output side of the stabilizing circuit 43 for supplying the stabilized power source voltage Erg. A collector of the transistor Q9 is connected to an output terminal OUTa.

A collector of the transistor Q15 is connected to a base of the transistor Q9 and also connected through the resistor R15 to the output side of the stabilizing circuit 43 for supplying the stabilized power source voltage Erg. A collector of the transistor Q15 is connected to an output terminal OUTb.

Emitters of the transistors Q9, Q15 are connected together to the current source of the current I2.

Respective bases and collectors of transistors Q9, Q11 are connected to each other. Respective bases and collectors of transistors Q13, Q15 are connected to each other. Emitters of the transistors Q11, Q13 are connected to each other. A connection point therebetween is connected to a current source of the current I1.

The current source 322 is formed of transistors Q7, Q8 and resistors R8, R9, R10 forming the current source of the current I1 and transistors Q10, Q12, Q14 and resistors R11, R13, R14 forming the current source of the current I2.

Specifically, an emitter of the transistor Q9 is grounded through the transistor Q10 and the resistor R11. A base of the transistor Q9 is supplied with the current I2 from the current generator unit 322. An emitter of the transistor Q15 is grounded through the transistor Q14 and the resistor R14. A base of the transistor Q14 is supplied with the current I2 from the current generator unit 323.

The transistor Q7 is diode-connected. Its collector is applied with the stabilized power source voltage Erg through the resistor R9, and its emitter is grounded through the resistor R8. A base of the transistor Q7 is connected to a base of the transistor Q8.

Therefore, assuming that a voltage between the base and emitter of the transistor Q7 is depicted by VBE, the current I1 satisfying $$I1=(Erg-VBE)/(R8+R9)$$

flows through the transistor Q8. Since, as described above, the stabilized power source voltage Erg has the same temperature characteristic as that of the band gap reference and has a value equal to the sum of the voltage VBE between the base and emitter of the transistor and a voltage proportional to kT/q (where k, T and q respectively depict the Boltzmann constant, the absolute temperature and a charge amount of electrons), study of the above equation reveals that a temperature characteristic of a current value of the current I1 is a positive temperature characteristic determined by kT/q and a temperature characteristic of a resistor.

The current generator unit 323 is formed of transistors Q3 to Q6, transistors P2 to P5, resistors R4 to R7 and a capacitor C1 and generates the current I2 which flows through the transistor P5.

In the current generator unit 323, both emitters of the transistors P2, P3 forming a current mirror are connected to a collector of the transistor P1. A collector of the transistor P2 is connected to a collector of the transistor Q4, and a collector of the transistor P3 is connected to a collector of the transistor Q6. The stabilized power source voltage Erg is divided by the resistors R4, R5. A base of the transistor Q4 is applied with a divided voltage Ed thereof (Ed=1 V in this embodiment). A collector of the transistor Q4 is connected to a base of the transistor Q6 through a base-collector path of the transistor P4. Since a negative feedback circuit is formed (the capacitor C1 and the resistor R6 are used for phase correction), a base potential of the transistor Q6 is also Ed (=1 V).

Therefore, a current Ia flowing through the transistor P4 is obtained by calculating the following equation;

$$Ia=Ed/R7.$$

Since the transistors P4, P5 form an arrangement of the current mirror, a value of the current I2 flowing through the transistor P5 is also expressed by $$I2=Ed/R7.$$

Since the voltage Ed is a voltage obtained by dividing the stabilized power source voltage Erg having almost no fluctuation due to temperature by a resistor as described above, the temperature characteristic of the current I2 is substantially proportional only to a resistance value of a resistor R7.

In this embodiment, the above current I1 is used to cancel the fluctuation of the oscillation frequency which results from change of a temperature characteristic of the oscillation transistor. The oscillation frequency of the oscillator circuit 32 will hereinafter be described with reference to equations.

FIG. 4 is a graph showing an oscillation waveform (simulated result) of the oscillation circuit 32. In FIG. 4, a waveform 51 is a waveform obtained at the collector of the transistor Q9, and a waveform 52 is a waveform obtained at the emitter of the transistor Q9.

As shown in FIG. 4, assuming that reference symbols TH, VC and I2 respectively depict a period half of one period of the oscillation frequency, a value half of a voltage change of the capacitor C2, and a current flowing the transistors Q10, Q14, then since the capacitor C2 is discharged by the current I2, the following equation 1 is established.

$$TH=(2\times VC)\times C2/I2 \quad (1)$$

Assuming that reference symbol VR depicts a voltage drop across the resistor R15 obtained when the transistors Q13, Q15 are set in their on-states, then the following equation 2 is established.

$$VR=R15\times(I1+2\times I2) \quad (2)$$

The reason for difference between the voltages VC and VR is that a voltage VBE1 obtained when the transistor Q9 is changed from its off-state to its on-state is different from a voltage VBE2 obtained when the transistor Q9 is kept in its on-state. Assuming that reference symbols Ic1 and Ic2 respectively depict a current obtained when the transistor Q9 is changed from its off-state to its on-state and a current obtained when the transistor Q9 is kept in its on-state, then the following equation 3 is established.

$$VR-VC=VBE2-VBE=kt/q\times ln(Ic2/Ic1) \quad (3)$$

If a term VC in the equation 1 is replaced with terms VR−(VR−VC) and the equations 2, 3 are substituted for the respective terms, then the following equation 4 is obtained.

$$TH=2\times\{R15\times(I1+2\times I2)-kt/q\times ln\ (Ic2/Ic1)\}\times C2/I2 \quad (4)$$

The current I1 is determined by values of the resistors R8, R9 and the transistor Q7 as described above and is expressed by the following equation 5;

$$I1=(Erg-VBE)\div R=kT/q\times N\div R \quad (5)$$

where N is a constant of proportion.

If the equation 5 is substituted for the term I1 of the equation 4, then the following equation 6 is obtained.

$$TH = 2 \times \{R15 \times (kT/q \times N \div R + 2 \times I2) - \qquad (6)$$
$$kT/q \times \ln(Ic2/Ic1)\} \times C2/I2$$
$$= 2 \times [kT/q\{R15 \times R/N - \ln(Ic2/Ic1)\} +$$
$$2 \times R15 \times I2] \times C2/I2$$

If the constant N of proportion is determined so as to satisfy $R15 \times R/N - \ln(Ic2/Ic1) = 0$, then the following equation 6 can be expressed by the following equation 7.

$$TH = 2 \times (2 \times R15 \times I2) \times C2/I2 = 4 \times R15 \times C2 \qquad (7)$$

Study of the equation 7 reveals that the oscillation frequency of the oscillator circuit 32 having a circuit arrangement shown in FIG. 3 is determined by a product of the resistance value of the resistor and the capacitance of the capacitor and hence is prevented from being influenced by the fluctuation of the characteristic of the transistor.

Therefore, as described above, when the resistance value of the second local oscillator circuit 32 is fluctuated due to the uneven characteristic of the IC, the oscillation frequency thereof is fluctuated in proportion to the fluctuation of the resistance value. As a result, the center frequency of the pass bandwidth of the band-pass filter 16 in the IC having a similarly fluctuated resistance value is fluctuated in the same proportion as the second local oscillation frequency is fluctuated. Hence, the first intermediate frequency is prevented from being influenced by the fluctuations of the center frequency of the pass-bandwidth of the band-pass filter 16 and the second local oscillation frequency.

As described above, according to the present invention, it is possible to realize the digital tuning system AM radio receiver in which the intermediate-frequency selecting device can be incorporated in its IC. Therefore, since the present invention can downsize the IC and does not require the external ceramic filter, the terminals of the IC can be reduced and it is possible to realize the inexpensive, thinner, and smaller AM radio receiver.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. An AM radio receiver comprising:

a first local oscillator circuit having an oscillator formed of a phase locked loop for producing two first local oscillation signals having respective phases different from each other by 90°;

a first mixer circuit supplied with one of said two first local oscillation signals from said first local oscillator circuit and with a received signal;

a second mixer circuit supplied with the other of said two first local oscillation signals from said first local oscillator circuit and with said received signal;

a first filter for deriving a first signal having a first intermediate frequency from a signal output from said first mixer circuit;

a second filter for deriving a second signal having said first intermediate frequency from a signal output from said second mixer circuit;

third and fourth mixer circuits respectively supplied with said first and second signals having said first intermediate frequency from said first and second filters;

a second local oscillator circuit for supplying to said third and fourth mixer circuits two second local oscillation signals having respective phases different from each other by 90°, said second local oscillator circuit including a voltage source producing a voltage fed to a voltage stabilizing circuit for producing a stabilized voltage having no fluctuation due to temperature changes and being fed to a stabilizing current circuit for producing a stabilizing current signal, and an astable multivibrator circuit connected to said stabilized voltage and being controlled by said stabilizing current signal for producing said two second local oscillation signals having no frequency fluctuation due to temperature changes;

an adding circuit for adding signals output from said third and fourth mixer circuits;

a third filter for obtaining a signal having a second intermediate frequency from a signal output from said adding circuit;

an intermediate-frequency amplifier circuit for amplifying said signal having said second intermediate frequency from said third filter; and an AM detecting circuit for detecting an amplitude of a signal output from said intermediate-frequency amplifying circuit to obtain an audio signal, wherein said first intermediate frequency is set to a predetermined nonzero frequency so that fluctuations of center frequencies of pass bandwidths of said first and second filters are limited within a bandwidth smaller than a half of a frequency step by which a reception frequency is changed.

2. The radio receiver according to claim 1, wherein said first intermediate frequency is set to 5 kHz, 4.5 kHz or smaller.

3. The AM radio receiver according to claim 1, wherein said second local oscillator circuit is formed of an oscillator circuit whose oscillation frequency is determined by a resistor having a predetermined resistance value and a capacitor having a predetermined capacitance value.

4. The AM radio receiver according to claim 1, wherein said second intermediate frequency is selected to be a frequency between said first intermediate frequency and 100 kHz.

* * * * *